United States Patent
Lin (10) Patent No.: US 8,767,847 B2
(45) Date of Patent: Jul. 1, 2014

(54) TIME-DEINTERLEAVER AND METHOD FOR INPUT SIGNAL PROCESSING AND COMPUTER PROGRAM PRODUCTS USING THE SAME

(75) Inventor: Chih Hsiu Lin, Jiaoxi Township, Yilan County (TW)

(73) Assignee: Mediatek Inc., Hsin-Chu (TW)

( * ) Notice: Subject to any disclaimer, the term of this patent is extended or adjusted under 35 U.S.C. 154(b) by 283 days.

(21) Appl. No.: 13/286,552

(22) Filed: Nov. 1, 2011

(65) Prior Publication Data

US 2013/0107936 A1    May 2, 2013

(51) Int. Cl.
*H04K 1/10* (2006.01)
*H04L 1/00* (2006.01)
*H03M 13/27* (2006.01)

(52) U.S. Cl.
CPC ......... *H04L 1/0052* (2013.01); *H03M 13/2732* (2013.01); *H04L 1/0071* (2013.01)
USPC .......................................... 375/260; 375/340

(58) Field of Classification Search
USPC .......................................... 375/260, 316, 340
See application file for complete search history.

(56) References Cited

U.S. PATENT DOCUMENTS

| | | | |
|---|---|---|---|
| 2003/0210749 A1* | 11/2003 | Asjadi ............................ | 375/260 |
| 2005/0135253 A1* | 6/2005 | Cai et al. ........................ | 370/236 |
| 2008/0107190 A1* | 5/2008 | Zhong et al. ................... | 375/260 |
| 2009/0074050 A1* | 3/2009 | Wang et al. .................... | 375/232 |
| 2009/0268856 A1* | 10/2009 | Okazaki et al. ................. | 375/343 |
| 2009/0274200 A1* | 11/2009 | Ikram et al. .................... | 375/219 |
| 2009/0310479 A1* | 12/2009 | Kisoda et al. .................. | 370/210 |
| 2011/0206150 A1* | 8/2011 | Lakkis ............................ | 375/260 |
| 2013/0107937 A1* | 5/2013 | Mudulodu et al. ............. | 375/240 |

* cited by examiner

*Primary Examiner* — Emmanuel Bayard
(74) *Attorney, Agent, or Firm* — McClure, Qualey & Rodack, LLP (57) ABSTRACT

A method for processing input data for use in a time-deinterleaver of a receiver is provided. Input data is first received, wherein the input data is data inputted to the time-deinterleaver and includes a plurality of symbols and each symbol includes a plurality of samples and each sample includes a signal quality (SQ) data corresponding thereto. A down sampling ratio is then determined according to a channel condition. The input data is down-sampled in the time and/or the frequency domain with the down sampling ratio according to whether a modulation mode is a single carrier mode or a multi-carrier mode and outputting the down-sampled data. Thereafter, the outputted down-sampled data is stored in a data buffer of the time-deinterleaver for further signal processing.

22 Claims, 6 Drawing Sheets

| Index | Row in Symbol | Column in symbol |
|---|---|---|
| 0-3 | 1 | 6 |
| 4-7 | 2 | 9 |
| 8-11 | 3 | 12 |
| 12-15 | 4 | 20 |
| ..... | ..... | ..... |

510 — Index
520 — Row in Symbol
530 — Column in symbol
500

TIME-DEINTERLEAVER AND METHOD FOR INPUT SIGNAL PROCESSING AND COMPUTER PROGRAM PRODUCTS USING THE SAME

BACKGROUND OF THE INVENTION

1. Field of the Invention

The invention relates to time-deinterleavers of a receiver and method for processing input signal thereof, and more particularly to time-deinterleavers of a receiver with low cost hardware architecture and method for processing an input signal thereof.

2. Description of the Related Art

Digital communications, such as that for digital TV broadcasting systems, commonly rely on interleaving transmitted signals at a transmitter side, and deinterleaving transmitted signals at a receiver side. The process of interleaving is commonly used in digital data transmission technology to protect transmissions from burst errors. Burst errors overwrite a significant amount of bits in a row. If occurring, a typical error correction scheme that anticipates more uniform distribution of burst errors may become overwhelmed. Interleaving is used to help prevent this from happening.

In a communications system, interleavers, often used at the transmitter side, and deinterleavers, often used at the receiver side, together, help to more uniformly spread out local signal variations in channels to improve the overall performance of the communications system. As details of the convolution interleaver and convolutional de-interleaver are well known to those skilled in the pertinent art, further description is omitted here for brevity.

In a digital audio broadcasting (DAB) or a digital terrestrial multimedia broadcasting (DTMB) system, a transmitter interleaves a signal before transmission and a receiver then deinterleaves the interleaved signal received from the transmitter. In the interleaving process, the transmitter sequentially writes transmission data in an interleaver memory, reads the written data in a predetermined sequence, and then transmits the read data. In this interleaving process called the "time interleaving process", the data is delayed for up to n frames (e.g. 16 frames), so that data input to the interleaver would be distributed over n frames when it is output. Therefore, to time-deinterleave the time-interleaved data, the receiver writes n-frame data in a deinterleaver memory (e.g. a Random Access Memory) and then reads the written data according to a deinterleaving rule matched to the interleaving rule used in the transmitter.

For time deinterleaving, the time-deinterleaver needs a memory with a capacity sufficient to store the n data frames. As the technique advances, the depth of the time-interleavers have becomes larger and larger. In a DTMB system, the depth of the time-interleaver is about 300 us (about 510 orthogonal frequency division Multiplexed (OFDM) symbols). The memory size to store the required deinterleaved data is above 1 M bits. If one symbol input to the deinterleaver is data subjected to 6-8-bit, the deinterleaver requires a 6-8 Mbit memory. This means that the deinterleaver must include a 6-8 Mbit memory, thus, increasing the cost of products made therefrom.

BRIEF SUMMARY OF THE INVENTION

Time-deinterleavers for receivers and methods for processing input data for use therein are provided.

An exemplary embodiment of a method for processing input data to be time-interleaved for use in a time-deinterleaver of a receiver is provided. Input data is first received, wherein the input data is data inputted to the time-deinterleaver and includes a plurality of symbols and each symbol includes a plurality of samples and each sample includes a signal quality (SQ) data corresponding thereto. A down sampling ratio is then determined according to a channel condition. The input data is down-sampled in the time and/or the frequency domain with the down sampling ratio according to whether a modulation mode is a single carrier mode or a multi-carrier mode and outputting the down-sampled data. Thereafter, the outputted down-sampled data is stored in a data buffer of the time-deinterleaver for further signal processing.

Moreover, an exemplary embodiment of a time-deinterleaver for a receiver comprises a down-sampling module and a data buffer. The down-sampling module receives input data, determines a down sampling ratio according to a channel condition, down-samples the input data in the time and/or the frequency domain with the down sampling ratio according to whether a modulation mode is a single carrier mode or a multi-carrier mode and outputs the down-sampled data, wherein the input data is data inputted to the time-deinterleaver and comprises a plurality of symbols and each symbol includes a plurality of samples and each sample includes a signal quality (SQ) data corresponding thereto. The data buffer is coupled to the down-sampling module and stores the outputted down-sampled data for further signal processing.

Another exemplary embodiment of a method for processing input data for use in a time-deinterleaver of a receiver is provided. Input data is received in a single carrier mode, wherein the input data is data inputted to the time-deinterleaver and comprises a plurality of symbols and each symbol includes a plurality of samples and each sample includes a signal quality (SQ) data corresponding thereto. A down sampling ratio is then determined according to a channel condition. The input data is down-sampled in the time domain with the down sampling ratio and the down-sampled data is outputted. Thereafter, the outputted down-sampled data is stored in a data buffer of the time-deinterleaver for further signal processing.

Another exemplary embodiment of a method for processing input data for use in a time-deinterleaver of a receiver is provided. Input data is received in a multi-carrier mode, wherein the input data is data inputted to the time-deinterleaver and comprises a plurality of symbols and each symbol includes a plurality of samples and each sample includes a signal quality (SQ) data corresponding thereto. A down sampling ratio is then determined according to a channel condition. The input data is down-sampled in the time domain or in both the time domain and the frequency domain with the down sampling ratio and the down-sampled data is outputted. Thereafter, the outputted down-sampled data is stored in a data buffer of the time-deinterleaver for further signal processing.

Methods for processing input data for use in a time-deinterleaver of a receiver and time-deinterleavers may take the form of a program code embodied in a tangible media. When the program code is loaded into and executed by a machine, the machine becomes an apparatus for practicing the disclosed method.

BRIEF DESCRIPTION OF THE DRAWINGS

The invention would become more fully understood by referring to the following detailed description with reference to the accompanying drawings, wherein.

DETAILED DESCRIPTION OF THE INVENTION

The following description is of the best-contemplated mode of carrying out the invention. This description is made for the purpose of illustrating the general principles of the invention and should not be taken during a limiting sense. The scope of the invention is best determined by reference to the appended claims.

Figure 1:
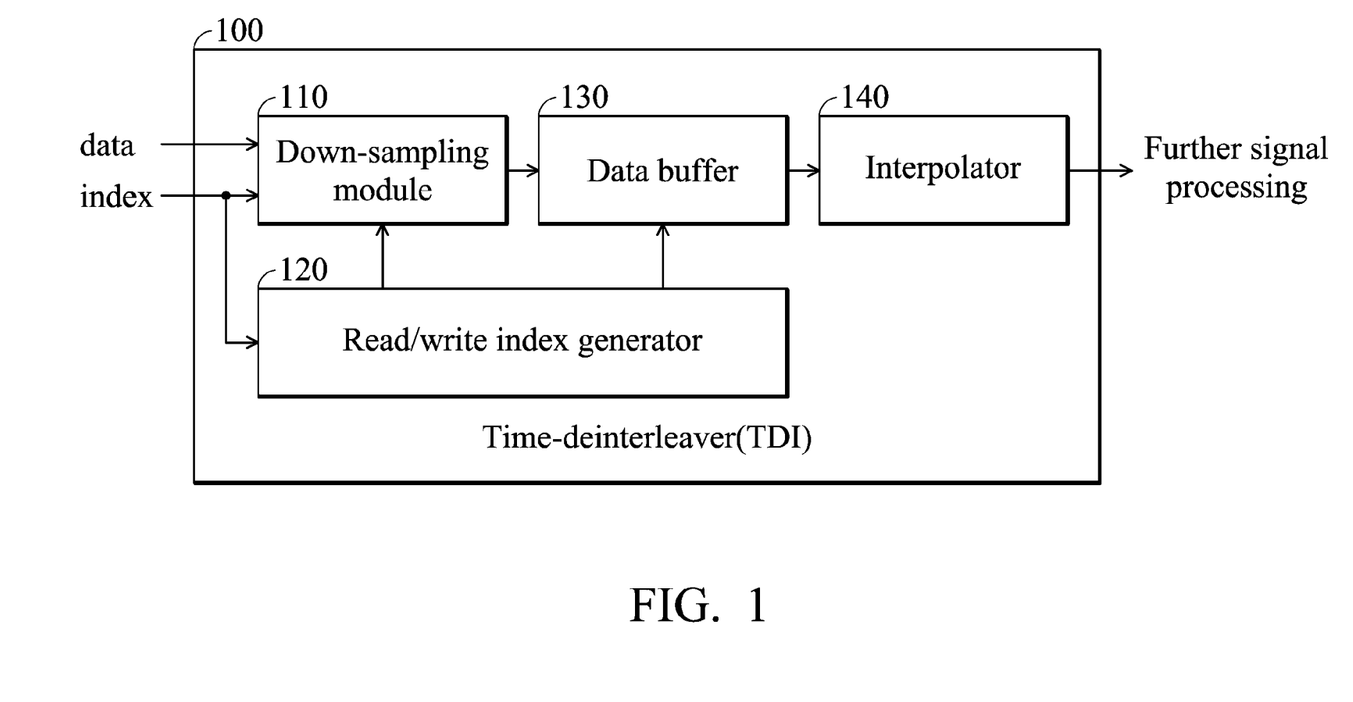
FIG. 1 is a schematic diagram illustrating an embodiment of a time-deinterleaver of the invention.

FIG. 1 is a schematic diagram illustrating an embodiment of a time-deinterleaver (TDI) of the invention. In one embodiment, the TDI 100 may be implemented in, for example, a digital terrestrial multimedia broadcasting (DTMB) receiver, but the invention is not limited thereto. The TDI 100 at least comprises a down-sampling module 110, a read/write index generator 120, a data buffer 130 and an interpolator 140. The down-sampling module 110 is used to down sample the input data in the time domain and/or the frequency domain, and output down-sampled data. It is to be noted that, the input data used hereinafter is data inputted to the TDI 100. That is, the input data is processed data processed by performing a number of front end processes, such as ADC processing, decoding, equalizing (EQ), frequency-deinterleaving and so on, on the transmitted data received from the transmitter and is to be de-interleaved by the TDI 100. The input data may be data processed in the time domain or data processed in the frequency domain depending on a modulation mode (e.g. a single-carrier mode or a multi-carrier mode) applied to the TDI 100. In some embodiments, when the TDI 100 is applied in a multi-carrier mode, the data of each symbol (e.g. the symbol shown in FIG. 2) may be processed by a frequency de-interleaver (FDI) (not shown) before it is processed by the time-deinterleaver. The input data may comprise information bits (I/Q) and the signal quality of IQ data. For example, the signal quality of IQ data may be channel state information (CSI). To recover a transmitted signal from a received signal, a receiver requires both an estimation of the channel, and an estimation of the noise/interference. The characterization of a channel is known as channel state information (CSI). It is to be noted that, although the input data may comprise the IQ data and the signal quality data of IQ data, only the signal quality data will be down-sampled in this embodiment. In other words, the IQ data will not be down-sampled.

The data buffer 130 is used to store the down-sampled data outputted by the down-sampling module 110. The read/write index generator 120 is used to generate the read/write index of the data buffer 130 to read data from or write data into the data buffer 130. The interpolator 140 is capable of performing an interpolation operation, e.g. to interpolate the data with the data stored in the data buffer 130, by using any well-known interpolation function, for example, but not limited to, such as linear interpolation.

The down-sampling module 110 may down sample the input data in the time domain and/or the frequency domain according to a down sample ratio that is determined based on the channel condition, such as whether the channel is a static or a mobile channel. The channel condition can be obtained when receiving the input data. The down sample ratio for the channel condition indicating that the channel is a static channel is larger than that for the channel condition indicating that the channel is a mobile channel.

The down-sampling module 110 may down sample the input data in the time domain and/or the frequency domain according to a currently applied modulation mode. In this embodiment, the modulation mode may be a single carrier mode or a multi-carrier mode. When the modulation mode is a single carrier mode, the down-sampling module 110 may only down sample the input data in the time domain. When the modulation mode is a multi-carrier mode, the down-sampling module 110 may only down sample the input data in the frequency domain or down sample the input data in both of the time domain and the frequency domain.

The input data may comprise a plurality of symbols, wherein each symbol includes a plurality of samples and each sample corresponds to one of the subcarriers and includes a signal quality (SQ) (e.g. CSI) data. In one embodiment, the input data may comprise a plurality of OFDM symbols.

Figure 2:
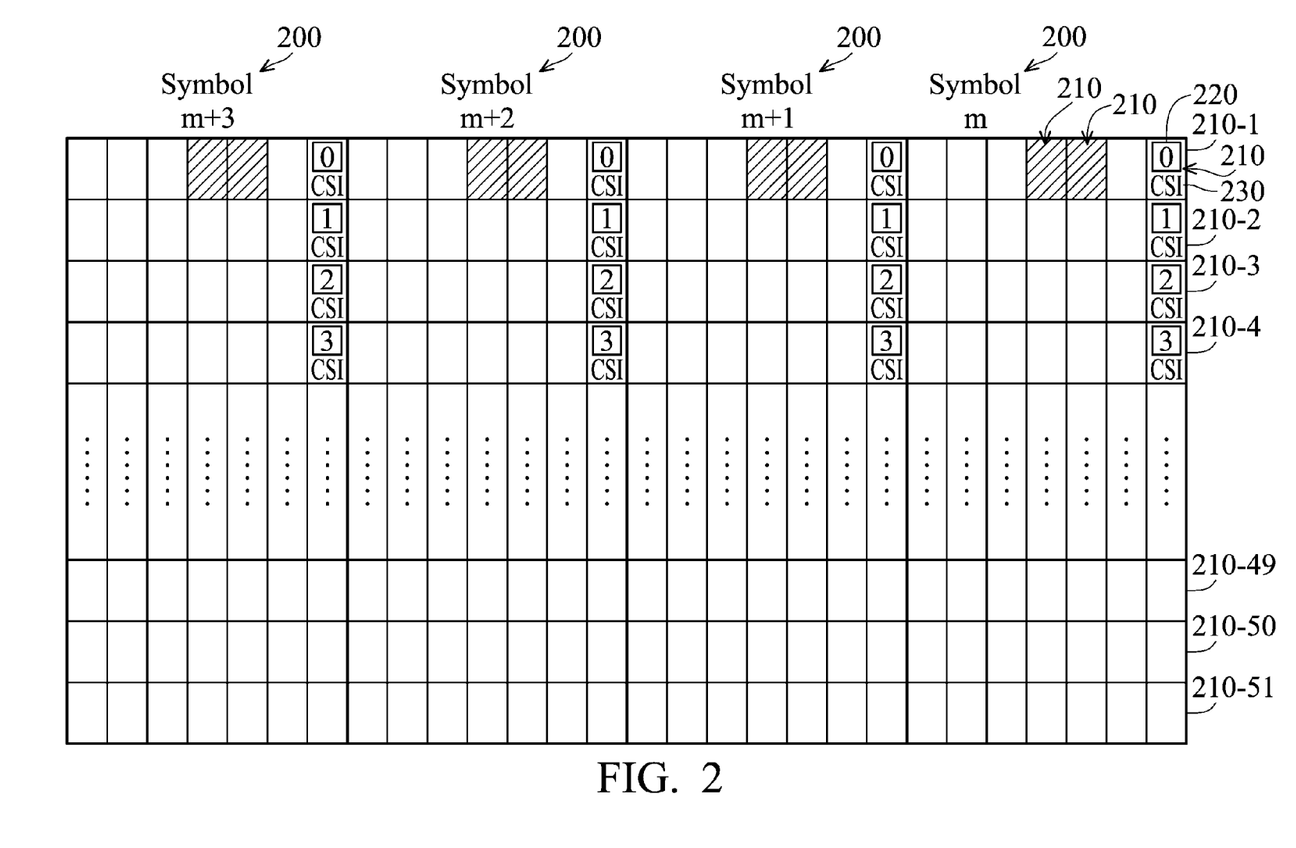
FIG. 2 is a schematic diagram illustrating an embodiment of a symbol content of the invention.

Referring to FIG. 2, FIG. 2 illustrates an embodiment of a symbol content of the invention. As shown in FIG. 2, the symbol 200 includes a plurality of samples 210 and each sample 210 corresponds to one of the subcarriers and at least includes a SQ (e.g. CSI) data 230. All of the samples 210 are arranged in a two-dimensional array, wherein the horizontal axis represents the time domain and the vertical axis represents the frequency domain. As shown in FIG. 2, the samples 210_1-210_51 are in the same row and are also referred to as time-neighbored samples in the time domain since the samples 210_1-210_51 may be sent at the same time. As aforementioned, the input data may be data processed in the time domain or data processed in the frequency domain depending on the modulation mode. In some embodiments, the sample may include index for pointing to the respective subcarrier. When the input data is data processed in the time domain, the indexes 220 of the samples 210 are arranged in order. For example, as shown in FIG. 2, the indexes 220 of the samples 210_1-210_5 in the same row may be arranged as 0, 1, 2, 3, 4, 5. When the input data is data processed in the frequency domain, the indexes 220 of the samples are not arranged in order since the originally ordered indexes 220 of the samples in the time domain may further be disarranged by the FDI to convert them into the frequency domain. For example, the indexes 220 of the samples 210_1-210_5 in the same row may be randomly rearranged as 210_20, 210_3, 210_5, 210_2, 210_7.

In some embodiments, when the TDI 100 is applied in a single carrier mode, the SQ data of I/Q data may be estimated with a decision direct scheme, which is performed sample by sample, in general. In this modulation mode, the SQ data of I/Q data may change slowly within several samples. Therefore, only the signal quality data per n-samples, which are time neighbored samples in the time domain, needs to be stored. The method for down-sampling the input data in a single carrier mode would be illustrated below.

Figure 3:
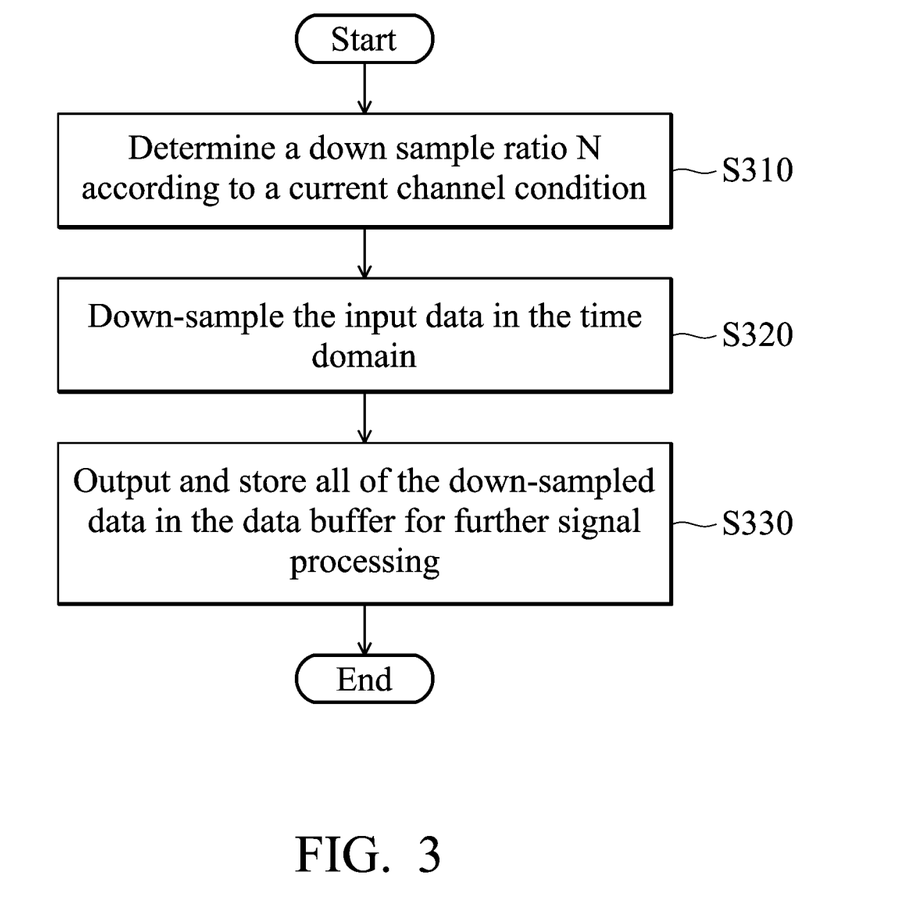
FIG. 3 is a flowchart illustrating an embodiment of a signal processing method in a single carrier mode of the invention.

FIG. 3 is a flowchart illustrating an embodiment of a signal processing method in a single carrier mode of the invention. The signal processing method can be performed by the TDI 100 shown in FIG. 1.

First, in step S310, the down-sampling module 110 determines a down sample ratio N according to a current channel condition, wherein the channel condition can be obtained while receiving the input data. The down sample ratio N for the channel condition indicating that the channel is a static channel is larger than that for the channel condition indicating that the channel is a mobile channel. For example, if the down sample ratio N for the channel condition indicating that the channel is a static channel is determined as 10, the down sample ratio N for the channel condition indicating that the channel is a mobile channel may be determined as 5 or 2. In general, the down-sample ratio is a design parameter, and can be determined in advance or adaptively adjusted.

After determining the down sample ratio N, in step S320, the down-sampling module 110 may only down-sample the input data in the time domain. That is, samples that are transmitted at the same/similar time can be down-sampled together. Each sample divided in the same sample group is time-neighbored samples in the time domain. In this step, the down-sampling module 110 may divide all samples within each symbol into a number of sample groups according to the determined down sample ratio N and select one sample from each sample group as a down-sampled data to down sample the input data. It is to be noted that, although the input data may comprise the IQ data and the signal quality data of IQ data, only the signal quality data will be down-sampled in this embodiment. In other words. the IQ data will not be down-sampled.

Thereafter, in step S330, the down sampling module 110 outputs and stores all of the down-sampled data in the data buffer 130 for further signal processing (e.g. for error correction).

For example, referring to FIG. 2, if the down sample ratio N is set to be 4, the down-sampling module 110 may divide all samples within each symbol into a number of sample groups by every 4 samples within a symbol and select one sample from each sample group as down-sampled data. Therefore, samples indexed by 0, 4, 8, . . . would be selected as down-sampled data to be stored in the data buffer 130, for example.

As only a portion of the samples within each symbol would be stored, the required buffer size of the data buffer 130 to store the SQ data of each sample would be significantly reduced, thus, saving on hardware costs.

For the samples within each sample group which are not stored, the SQ data thereof may be determined with reference to the SQ data of the selected sample due to the fact that SQ data changes slowly within the same sample group.

In some embodiments, when the TDI 100 is applied in a multi-carrier mode, the data of each symbol (e.g. the symbol shown in FIG. 2) may be processed by the frequency de-interleaver (FDI) before it is processed by the time-deinterleaver. Therefore, the SQ data of I/Q data would be very different for adjacent elements of time-deinterleaver. In this mode, the SQ data of I/Q data may change slowly in the same sub-carrier within several symbols (e.g. OFDM symbols). Therefore, storing the SQ data of the whole OFDM symbol per n-symbols is needed. The method for down-sampling the input data in a multi-carrier mode would be illustrated below.

Figure 4:
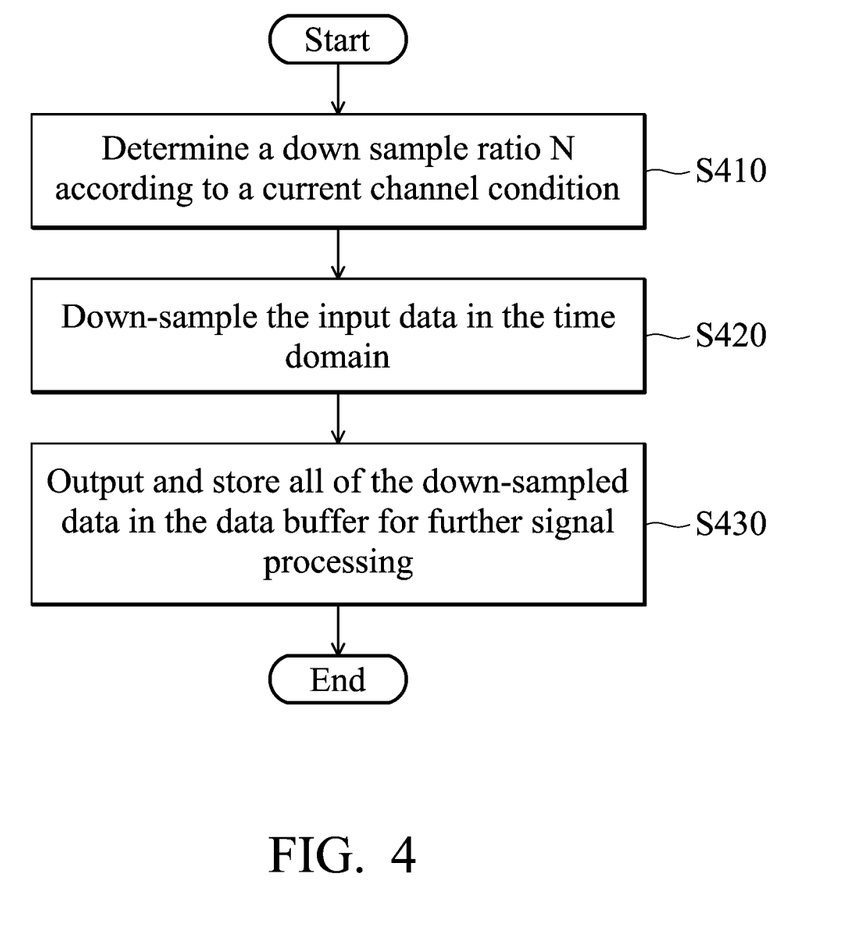
FIG. 4 is a flowchart illustrating an embodiment of a signal processing method in a multi-carrier mode of the invention.

FIG. 4 is a flowchart illustrating an embodiment of a signal processing method in a multi-carrier mode of the invention. The signal processing method can be performed by the TDI 100 shown in FIG. 1.

First, in step S410, the down-sampling module 110 determines a down sample ratio N according to a current channel condition, wherein the channel condition can be obtained while receiving the input data. The down sample ratio N for the channel condition indicating that the channel is a static channel is larger than that for the channel condition indicating that the channel is a mobile channel. In general, the down-sample ratio is a design parameter, and can be determined in advance or adaptively adjusted.

After determining the down sample ratio N, in step S420, the down-sampling module 110 may down-sample the input data in the time domain. That is, samples that are transmitted at the same/similar time can be down-sampled together. All symbols divided in the same symbol group are time-neighbored symbols in the time domain. In this step, the down-sampling module 110 may divide all symbols within the input data into a number of symbol groups in the time domain according to the determined down sample ratio N and select one symbol from each symbol group as a down-sampled data to down sample the input data. Note that, as aforementioned, only the signal quality data within the input data will be down-sampled while the IQ data within the input data will not be down-sampled in this embodiment.

Thereafter, in step S430, the down sampling module 110 outputs and stores all of the down-sampled data in the data buffer 130 for further signal processing (e.g. for error correction). For example, referring to FIG. 2, if the down sample ratio N is set to be 4, the down-sampling module 110 may divide all symbols within the input data into a number of symbol groups by every 4 symbols and select one symbol from each symbol group as a down-sampled data. Therefore, symbols indexed by 0, 4, 8, . . . would be selected as down-sampled data to be stored in the data buffer 130. Similarly, as only a portion of the symbols within the input data would be stored, the required buffer size of the data buffer 130 to store SQ data would be significantly reduced, thus saving on hardware costs.

For the samples which are not stored, which are within each symbol group which are not stored, the SQ data thereof may be determined with reference to the selected one due to the fact that SQ data of I/Q data may change slowly in the same sub-carrier within symbols of the same symbol group. In a multi-carrier mode, if the SQ data, i.e. CSI, of one OFDM symbol is not restored, its value must be interpolated. For example, referring to FIG. 2, if the CSI of symbol m and m+3 are stored, the CSI of symbol m+1 and m+2 may be interpolated with that of symbol m and m+3. The interpolation may depend on, for example, time distance and/or symbol noise difference between the symbols, but the invention is not limited thereto. The interpolation can be performed by the interpolator 140 using any well-known interpolation function, for example, but not limited to, such as linear interpolation.

Figure 5:
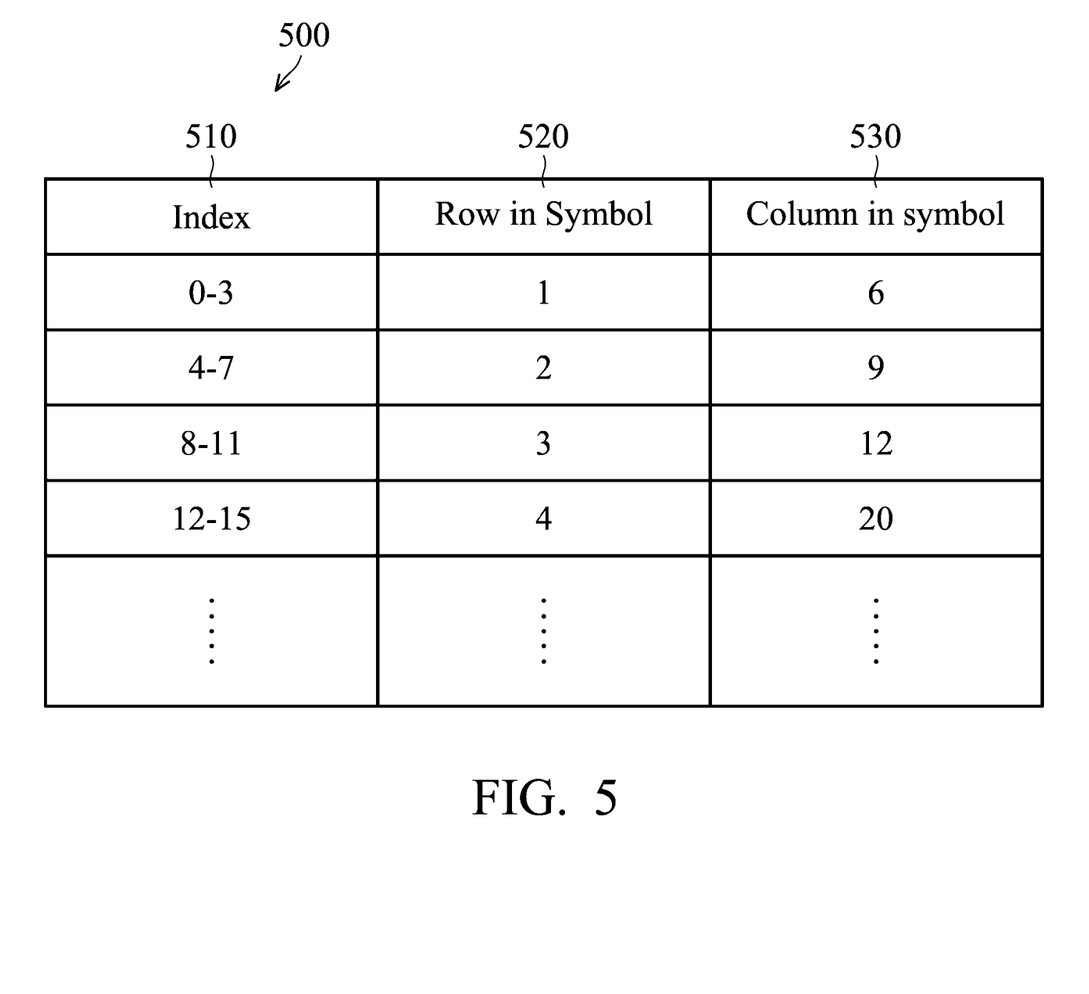
FIG. 5 is a schematic diagram illustrating an embodiment of a lookup table of the invention.

In some embodiments, to further reduce the buffer size of the data buffer 130 required to store the SQ data, the down-sampling module 110 may further down-sample the stored symbol in the frequency domain in the multi-carrier mode after the aforementioned down-sampling process in the time domain has been performed. That is, the down-sampling module 110 may further down-sample the input data in both the frequency domain and the time domain in the multi-carrier mode. In a multi-carrier mode, assume that the CSI value changes slowly in the frequency domain before the frequency de-interleaver performs de-interleaving in the frequency domain. In this case, every set of m-samples within the stored symbol can be grouped to generate a number of sample groups and only one CSI value of each sample group would be stored. Other CSI values of the samples which are not stored within the same sample group can be replaced with the stored value. In one embodiment, the buffered CSI of each group is the last element out of the TDI in the original TDI structure. A predefined look-up table which indicates the index corresponding to each location is further provided such that the down-sampling module 110 may determine the CSI values of the other samples which are not stored by table lookup using the look-up table. Reference is now made to FIG. 5, which illustrates a schematic diagram illustrating an embodiment of a lookup table 500 of the invention. As shown in FIG. 5, the lookup table 500 at least includes an index field 510, a row field 520 and a column field 530. The index field 510 represents the index in order (from small to large or vice versa) and the row field 520 and the column field 530 represent the row and the column information of the corresponding sample having SQ data assigned thereto which corresponds to the index field 510 within the symbol, respectively. Therefore, other CSI values of the samples which are not stored within the same sample group can be obtained and replaced with the CSI value of the corresponding sample by using the lookup table 500. For example, as shown in FIG. 5, the samples which index field 510 have indexed as 1, 2, 3 point to the same samples indexed as 0 so that CSI values of the sample indexed by 1, 2, 3 can be determined as the same as that of the sample indexed by 0. Similarly, the samples which index field 510 have indexed as 5, 6, 7 point to the same samples indexed as 4 and the samples which index field 510 have indexed as 9, 10, 11 point to the same samples indexed as 8 so that CSI values of the sample indexed by 5, 6, 7 can be determined as the same as that of the sample indexed by 4 and CSI values of the sample indexed by 9, 10, 11 can be determined as the same as that of the sample indexed by 8, respectively. Another method for down-sampling the input data in the multi-carrier mode will be illustrated below.

Figure 6:
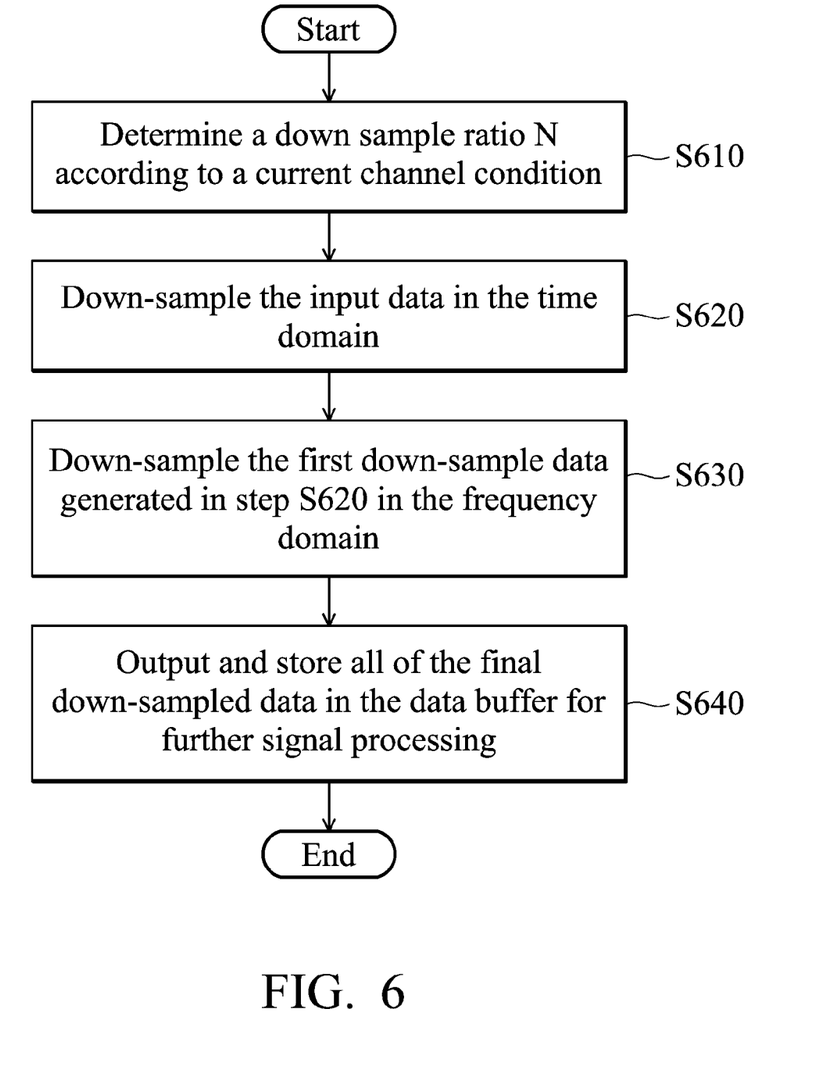
FIG. 6 is a flowchart illustrating another embodiment of a signal processing method in a multi-carrier mode of the invention.

FIG. 6 is a flowchart illustrating another embodiment of a signal processing method in a multi-carrier mode of the invention. The signal processing method can be performed by the TDI 100 shown in FIG. 1.

First, in step S610, the down-sampling module 110 determines a down sample ratio N according to a current channel condition, wherein the channel condition can be obtained while receiving the input data. The down sample ratio N for the channel condition indicating that the channel is a static channel is larger than that for the channel condition indicating that the channel is a mobile channel. In general, the down-sample ratio is a design parameter, and is determined in advance.

After determining the down sample ratio N, in step S620, the down-sampling module 110 may down-sample the input data in the time domain. In this step, the down-sampling module 110 may divide all symbols within the input data into a number of symbol groups in the time domain according to the determined down sample ratio N and select one symbol from each symbol group as a first down-sampled data to down sample the input data in time domain. Note that, as aforementioned, only the signal quality data within the input data will be down-sampled while the IQ data within the input data will not be down-sampled in this embodiment.

After determining the first down-sample data (i.e. the symbols to be stored), in step S630, the down-sampling module 110 further down-samples the first down-sample data generated in step S620 in the frequency domain. In this step, the down-sampling module 110 may divide all samples within each symbol into a number of sample groups in the frequency domain according to the determined down sample ratio N (may not be the same as N in time direction) and select one sample from each sample group as a second down-sampled data to down sample the input data in the frequency domain. Thereafter, in step S640, the down sampling module 110 outputs and stores all of the second down-sampled data in the data buffer 130 for further signal processing (e.g. for error correction). For example, referring to FIG. 2, if the down sample ratio N is set to be 4, the down-sampling module 110 may first divide all symbols within the input data into a number of symbol groups by every 4 symbols and select one symbol from each symbol group as a first down-sampled data.

The down-sampling module 110 may then divide all samples within each stored symbol into a number of sample groups by every 4 (may not be the same as 4 in time direction) samples for each first down-sampled data and select one sample from each sample group as a second down-sampled data. Therefore, samples indexed by 0, 4, 8, . . . for each stored symbol (e.g. symbol m) would be selected as second down-sampled data to be stored in the data buffer 130.

It is to be understood that, although in this embodiment, the input data is first down-sampled in the time domain and then down-sampled in the frequency domain to generate the second down-sampled data to be stored in the data buffer 130, but the invention is not limited thereto. In some embodiment, the input data may first be down-sampled in the frequency domain and then be down-sampled in the time domain to generate the second down-sampled data to be stored in the data buffer 130.

As only a portion of the symbols and partial of the samples within the input data would be stored, the required buffer size of the data buffer 130 to store SQ data would be further reduced.

In summary, according to the time-deinterleaver and method thereof of the invention, for the de-interleaver data including information bit (I/Q) and the signal quality data (e.g. CSI) of IQ data, the signal quality of I/Q (e.g. the CSI) can be down-sampled in time domain when the applied modulation mode is a single-carrier mode or the signal quality of I/Q can be down-sampled in time domain or frequency domain only or in both time domain and frequency domain when the applied modulation mode is a multi-carrier mode and then buffered in the time-deinterleaver memory (i.e. the data buffer of the time-deinterleaver), such that the required buffer size of the data buffer to store SQ data can be reduced, thereby saving costs and improving yield rates. Moreover, the signal quality of IQ data of samples which are not stored can be determined by an interpolation operation and the down sample ratio of the signal quality of I/Q data is feasible based on the channel condition. Furthermore, the time-deinterleaver and signal processing method thereof of the invention can be applied to both single carrier and multi-carrier modulation systems.

While the invention has been described by way of example and in terms of preferred embodiment, it is to be understood that the invention is not limited thereto. Those who are skilled in this technology can still make various alterations and modifications without departing from the scope and spirit of this invention (e.g., use a ring buffer). Therefore, the scope of the present invention shall be defined and protected by the following claims and their equivalents.

What is claimed is:

1. A method for processing input data for use in a time-deinterleaver of a receiver, comprising:

receiving input data, wherein the input data is data inputted to the time-deinterleaver and comprises a plurality of symbols and each symbol includes a plurality of samples and each sample includes a signal quality (SQ) data corresponding thereto;

determining a down sampling ratio according to a channel condition;

down-sampling the input data in the time and/or the frequency domain with the down sampling ratio according to whether a modulation mode is a single carrier mode or a multi-carrier mode and outputting the down-sampled data; and storing the outputted down-sampled data in a data buffer of the time-deinterleaver for further signal processing.

2. The method as claimed in claim 1, wherein the down-sampling step further comprises:
down-sampling the input data in the time domain with the down sampling ratio when the modulation mode is the single carrier mode.

3. The method as claimed in claim 2, wherein the step of down-sampling the input data in the time domain with the down sampling ratio further comprises:
dividing all of the samples within each symbol into a number of sample groups according to the determined down sample ratio, wherein each sample divided in the same sample group are time-neighbored samples in the time domain; and
selecting one sample from each sample group as a down-sampled data to down sample the input data.

4. The method as claimed in claim 3, further comprising:
for each sample group, determining the SQ data of samples which are not selected/samples which are not stored according to the selected down-sampled data.

5. The method as claimed in claim 1, wherein the down-sampling step further comprises:
down-sampling the input data in the time domain or in the frequency domain with the down sampling ratio when the modulation mode is the multi-carrier mode.

6. The method as claimed in claim 5, wherein the step of down-sampling the input data in the time domain with the down sampling ratio further comprises:
dividing all of the symbols within the input data into a number of symbol groups according to the determined down sample ratio, wherein each symbol divided in the same symbol group are time-neighbored symbols in the time domain; and
selecting one symbol from each symbol group as a down-sampled data to down sample the input data.

7. The method as claimed in claim 6, further comprising:
for each symbol group, determining the SQ data of symbols which are not selected/symbols which are not stored by performing an interpolation operation on the selected down-sampled data.

8. The method as claimed in claim 1, wherein the down-sampling step further comprises:
down-sampling the input data in both the time domain and the frequency domain with the down sampling ratio when the modulation mode is the multi-carrier mode.

9. The method as claimed in claim 8, wherein the step of down-sampling the input data in the time domain and the time domain with the down sampling ratio further comprises:
dividing all of the symbols within the input data into a number of symbol groups according to the determined down sample ratio, wherein each symbol divided in the same symbol group are time-neighbored symbols in the time domain;
selecting one symbol from each symbol group as a first down-sampled data;
dividing all of the samples within each of the first down-sampled data into a number of sample groups according to the determined down sample ratio, wherein each sample divided in the same sample group are frequency-neighbored samples in the frequency domain; and
selecting one sample from each sample group as a second down-sampled data and outputting the second down-sampled data.

10. The method as claimed in claim 9, further comprising:
for each symbol group, determining the SQ data of samples which are not selected/samples which are not stored within symbols which are not selected/symbols which are not stored by table lookup using a predefined lookup table.

11. The method as claimed in claim 1, wherein the symbol comprises an orthogonal frequency division Multiplexed (OFDM) symbol.

12. A time-deinterleaver of a receiver, comprising:
a down-sampling module, receiving input data, determining a down sampling ratio according to a channel condition, down-sampling the input data in the time and/or the frequency domain with the down sampling ratio according to whether a modulation mode is a single carrier mode or a multi-carrier mode and outputting the down-sampled data, wherein the input data is data inputted to the time-deinterleaver and comprises a plurality of symbols and each symbol includes a plurality of samples and each sample includes a signal quality (SQ) data corresponding thereto; and
a data buffer coupled to the down-sampling module, storing the outputted down-sampled data for further signal processing.

13. The time-deinterleaver as claimed in claim 12, wherein the down-sampling module further down-samples the input data in the time domain with the down sampling ratio when the modulation mode is the single carrier mode.

14. The time-deinterleaver as claimed in claim 13, wherein the down-sampling module further divides all of the samples within each symbol into a number of sample groups according to the determined down sample ratio and selects one sample from each sample group as a down-sampled data to down sample the input data, wherein each sample divided in the same sample group are time-neighbored samples in the time domain.

15. The time-deinterleaver as claimed in claim 14, wherein the SQ data of samples which are not selected/samples which are not stored for each sample group are determined according to the selected down-sampled data.

16. The time-deinterleaver as claimed in claim 12, wherein the down-sampling module further down-samples the input data in the time domain or the frequency domain with the down sampling ratio when the modulation mode is the multi-carrier mode.

17. The time-deinterleaver as claimed in claim 16, wherein the down-sampling module further divides all of the symbols within the input data into a number of symbol groups according to the determined down sample ratio and selects one symbol from each symbol group as a down-sampled data to down sample the input data, wherein each symbol divided in the same symbol group are time-neighbored symbols in the time domain.

18. The time-deinterleaver as claimed in claim 17, further comprising an interpolator for determining the SQ data of symbols which are not selected/symbols which are not stored by an interpolation operation according to the selected down-sampled data for each symbol group.

19. The time-deinterleaver as claimed in claim 12, wherein the down-sampling module further down-samples the input data in both the time domain and the frequency domain with the down sampling ratio when the modulation mode is the multi-carrier mode.

20. The time-deinterleaver as claimed in claim 19, wherein the down-sampling module further divides all of the symbols within the input data into a number of symbol groups according to the determined down sample ratio, selects one symbol from each symbol group as a first down-sampled data, divides all of the samples within each of the first down-sampled data into a number of sample groups according to the determined down sample ratio, selects one sample from each sample group as a second down-sampled data and outputs the second down-sampled data.

21. A method for processing input data for use in a time-deinterleaver of a receiver, comprising:
   receiving input data in a single carrier mode, wherein the input data is data inputted to the time-deinterleaver and comprises a plurality of symbols and each symbol includes a plurality of samples and each sample includes a signal quality (SQ) data corresponding thereto;
   determining a down sampling ratio according to a channel condition;
   down-sampling the input data in the time domain with the down sampling ratio and outputting the down-sampled data; and
   storing the outputted down-sampled data in a data buffer of the time-deinterleaver for further signal processing.

22. A method for processing input data for use in a time-deinterleaver of a receiver, comprising:
   receiving input data in a multi-carrier mode, wherein the input data is data inputted to the time-deinterleaver and comprises a plurality of symbols and each symbol includes a plurality of samples and each sample includes a signal quality (SQ) data corresponding thereto;
   determining a down sampling ratio according to a channel condition;
   down-sampling the input data in the time domain or in both the time domain and the frequency domain with the down sampling ratio and outputting the down-sampled data; and
   storing the outputted down-sampled data in a data buffer of the time-deinterleaver for further signal processing.

* * * * *